United States Patent [19]

Misic et al.

[11] Patent Number: 4,839,594

[45] Date of Patent: Jun. 13, 1989

[54] FARADAY SHIELD LOCALIZED COIL FOR MAGNETIC RESONANCE IMAGING

[75] Inventors: George J. Misic, Novelty; G. Neil Holland, Chagrin Falls; Mehrdad Mehdizadeh, University Hts.; John L. Patrick, Solon, all of Ohio

[73] Assignee: Picker International, Inc., Highland Hts., Ohio

[21] Appl. No.: 120,475

[22] Filed: Nov. 13, 1987

Related U.S. Application Data

[63] Continuation-in-part of Ser. No. 86,277, Aug. 17, 1987, and a continuation-in-part of Ser. No. 931,726, Nov. 17, 1986, Pat. No. 4,752,738, and a continuation-in-part of Ser. No. 765,708, Aug. 14, 1985, Pat. No. 4,793,356.

[51] Int. Cl.[4] ............................................ G01R 33/20
[52] U.S. Cl. .................................... 324/318; 324/322; 333/222
[58] Field of Search ............... 324/307, 309, 318, 322; 333/222; 343/741, 744, 745, 748, 841, 842, 866; 455/291

[56] References Cited

U.S. PATENT DOCUMENTS

| 2,110,392 | 3/1938 | Dorr | 128/798 |
|---|---|---|---|
| 2,315,173 | 3/1943 | Wald | 455/291 |
| 3,703,685 | 11/1972 | Simopoulos et al. | 455/291 |
| 3,774,218 | 11/1973 | Fowler | 455/291 |
| 4,095,168 | 6/1978 | Hlavka | 324/0.5 |
| 4,617,936 | 10/1986 | Malko | 128/653 |
| 4,621,237 | 11/1986 | Timms et al. | 324/322 |
| 4,634,980 | 1/1987 | Misic et al. | 324/322 |
| 4,649,348 | 3/1987 | Flugan | 324/318 |
| 4,728,896 | 3/1988 | Bendall et al. | 324/309 |
| 4,746,866 | 5/1988 | Röschmann | 324/318 |
| 4,763,074 | 8/1988 | Fox | 324/318 |
| 4,775,837 | 10/1988 | Röschmann | 324/318 |

FOREIGN PATENT DOCUMENTS

744116 2/1956 United Kingdom ............... 343/866

OTHER PUBLICATIONS

"Noise Performance of Surface Coils for Magnetic Resonance Imaging at 1.5T" by Hayes, Medical Physics, vol. 12, No. 5, Sep./Oct. 1985, pp. 604–607.

"Flexible Transmission Line Resonators for High Quality MR Imaging" by Bader et al., SMRM Book of Abstracts 1986.

Kan et al., "Aversatile . . . NMR Spectrometer", Rev. Sci. Instrum., vol. 44, No. 12, Dec. 1973.

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

Magnet (12) creates a main magnetic field along a z-axis through an image region. A localized coil (D) is disposed in the image region at least to receive magnetic resonance signals from nuclei of the subject which have been induced to resonance. The localized coil includes an inner conductor (30), an outer conductor (32), and a dielectric material (52) therebetween. The outer conductor defines a gap (50) midway between its ends. One end of the inner conductor is connected with a gate of an FET transistor (66) and the outer conductor is connected with its source. The transistor source and drain are connected by a coaxial transmission cable (38) with a DC power supply (70) which provides a DC bias across the transistor source and drain. The cable also connects the transistor with a radio frequency receiver (40) to convey preamplified magnetic resonance signals thereto. The other end of the inner conductor may be connected with the outer conductor to provide an unbalanced localized coil or the ends may each be connected with an FET transistor (66a, 66b) in a balanced coil arrangement (FIG. 9).

24 Claims, 7 Drawing Sheets

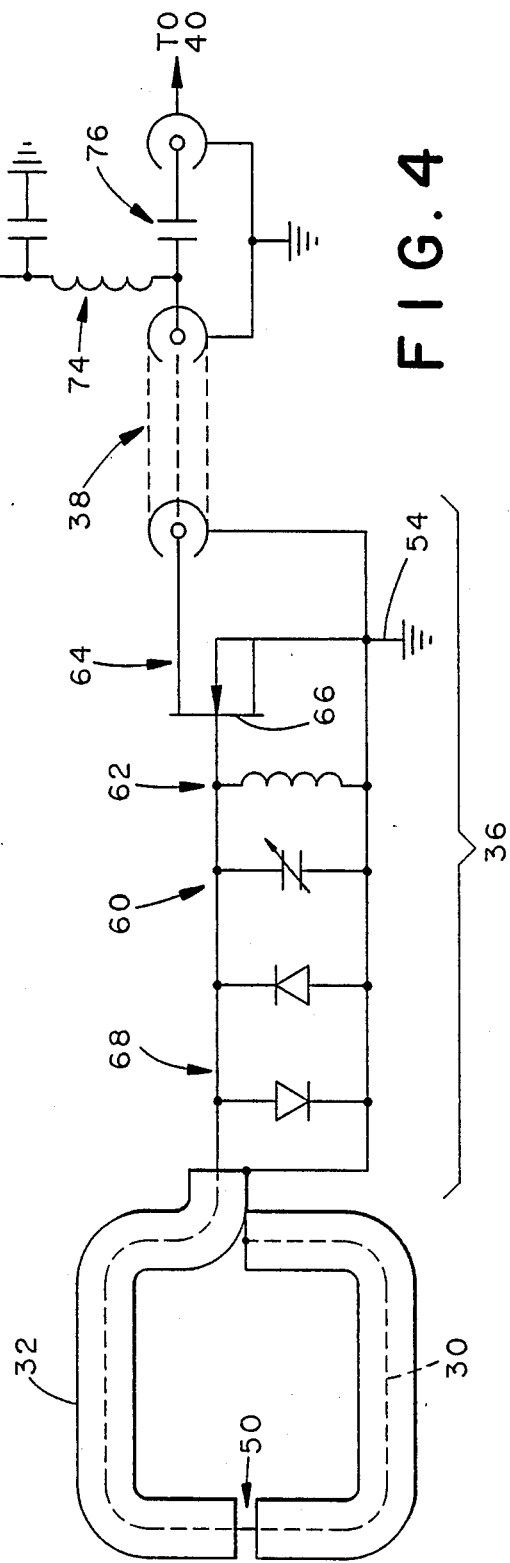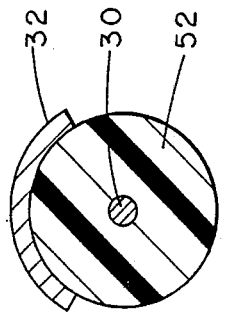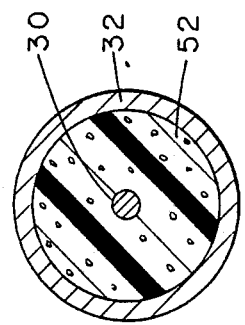
FIG. 4
FIG. 5
FIG. 3

4,839,594

FARADAY SHIELD LOCALIZED COIL FOR MAGNETIC RESONANCE IMAGING

The present application is a continuation-in-part of prior pending applications Ser. No. 086,277 (PKR 2 073), filed Aug. 17, 1987, Ser. No. 931,726 (PKR 2 035), filed Nov. 17, 1986, now 4,752,738 and Ser. No. 765,708 (PKR 2 002), filed Aug. 14, 1985, now 4,793,356.

BACKGROUND OF THE INVENTION

The present invention relates to the magnetic resonance arts. It finds particular application in conjunction with localized coils for medical imaging equipment which receive electromagnetic signals from resonating nuclei and will be described with particular reference thereto. It is to be appreciated, however, that the invention may also find utility in other magnetic resonance and radio frequency antenna applications, such as exciting resonance, chemical analysis, well logging, and the like.

Heretofore, various types of coils have been positioned to receive electromagnetic signals for magnetic resonance imaging and spectroscopy, e.g. whole body, body portion, and localized coils. The whole body and portion receiving coils had standard sizes which were selected for readily receiving the patient's whole body or a selected portion. Due to the standardized coil size and variable patient size, a void or empty region was commonly defined between the coil and the portion of the patient to be imaged.

Localized or surface coils were configured from rigid or flexible non-conductive sheets on which conductive loops were mounted. Rigid, flat coils were constructed in a variety of sizes to facilitate positioning adjacent the selected area of the patient to be imaged. When a flat coil was positioned adjacent to a relatively flat area of the patient, the intervening air gap was relatively small.

To receive signals from deeper within the patient, larger diameter loops were utilized. The depth of the coil's region of sensitivity has been adjusted by selecting more complex winding patterns. However, the complex loop arrangements still had the high magnetic energy losses of the single loop.

Another approach was to construct the localized coil from a loop of quarter length 50 ohm coaxial cable with a gap cut into the outer shield. The quarter wave length loop would be connected integrally with an n$\lambda$/2 transmission line.

One of the problems with the prior art localized coils resided in coupling between the sample or patient and the coil, which coupling degraded the Q or quality factor of the coil. The closer the surface coil was placed to the patient, the more the coupling problem was accentuated. Although the use of quarter wave length coaxial cable with a gap cut into the outer sheathing reduced such coupling, the coaxial cable coils were load sensitive. Changes in the patient or load would affect the Q value of the coil, the tuning, the matching, and the coil performance.

In the present application, localized coils are provided which overcome the above referenced problems and others. In a receive mode, an improved signal-to-noise ratio is achieved.

SUMMARY OF THE INVENTION

In accordance with the present invention, a localized coil assembly is provided. An inner conductor defines a first current path adjacent a surface of a subject. An outer conductor defines a current path or Faraday shield along the inner conductor and at least partially therearound. The outer conductor is disposed between the surface of the subject and the inner conductor except where an opening is defined in the outer conductor. At one end, the inner and outer conductors are connected together and at the other end they are connected with an interface circuit which interconnects the conductors with a cable extending to a receiver.

In accordance with a more limited aspect of the invention, the interface circuit includes a preamplifier.

In accordance with a more limited aspect of the invention, a high velocity factor, high impedance dielectric is provided between the inner and outer conductors.

In accordance with another more limited aspect of the present invention, the preamplifier includes a J-FET, a MOSFET or other transistor whose base or gate is connected with the inner conductor.

In accordance with another more limited aspect of the present invention, electric elements are provided in series with the inner or outer conductors, such as a capacitive coupling in the inner conductor or a pair of crossed diodes connected with the outer conductor across the gap.

In accordance with another more limited aspect of the present invention, an adjustable impedance is connected with the inner and outer conductors adjacent the preamplifier for adjusting tuning, impedance matching, or the like.

In accordance with another aspect of the present invention, a balanced coil arrangement is provided in which neither end of the center conductor is connected with the outer conductor. Rather, the center conductors are connected with a balanced pair of preamplifier means, such as the gate contact of transistors arranged in a push-pull configuration.

One advantage of the present invention is that it improves the Q factor of the coil.

Another advatage of the present invention resides in the reduction of the interaction between the localized coil and the subject.

Another advantage of the present invention is that it enables localized coils to be operated over a wide range of frequencies, including frequencies above and below the self resonance frequency.

Yet another advnatage of the present invention resides in a completely passive interface between the localized coil and transmission cable.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts or in various steps and arrangements of steps. The drawings are only for purposes of illustrating preferred embodiments and are not to be construed as limiting the invention.

FIG. 3 is a cross sectional view through section 3—3 of FIG. 2;

FIG. 4 is a schematic diagram illustrating the electrical interface circuitry associated with the coil of FIG. 2;

FIG. 5 is a cross sectional view of an alternate embodiment to the coil of FIG. 1;

DETAILED DESCRIPTION OF THE PREFERRED EMBODIMENTS

Figure 1:
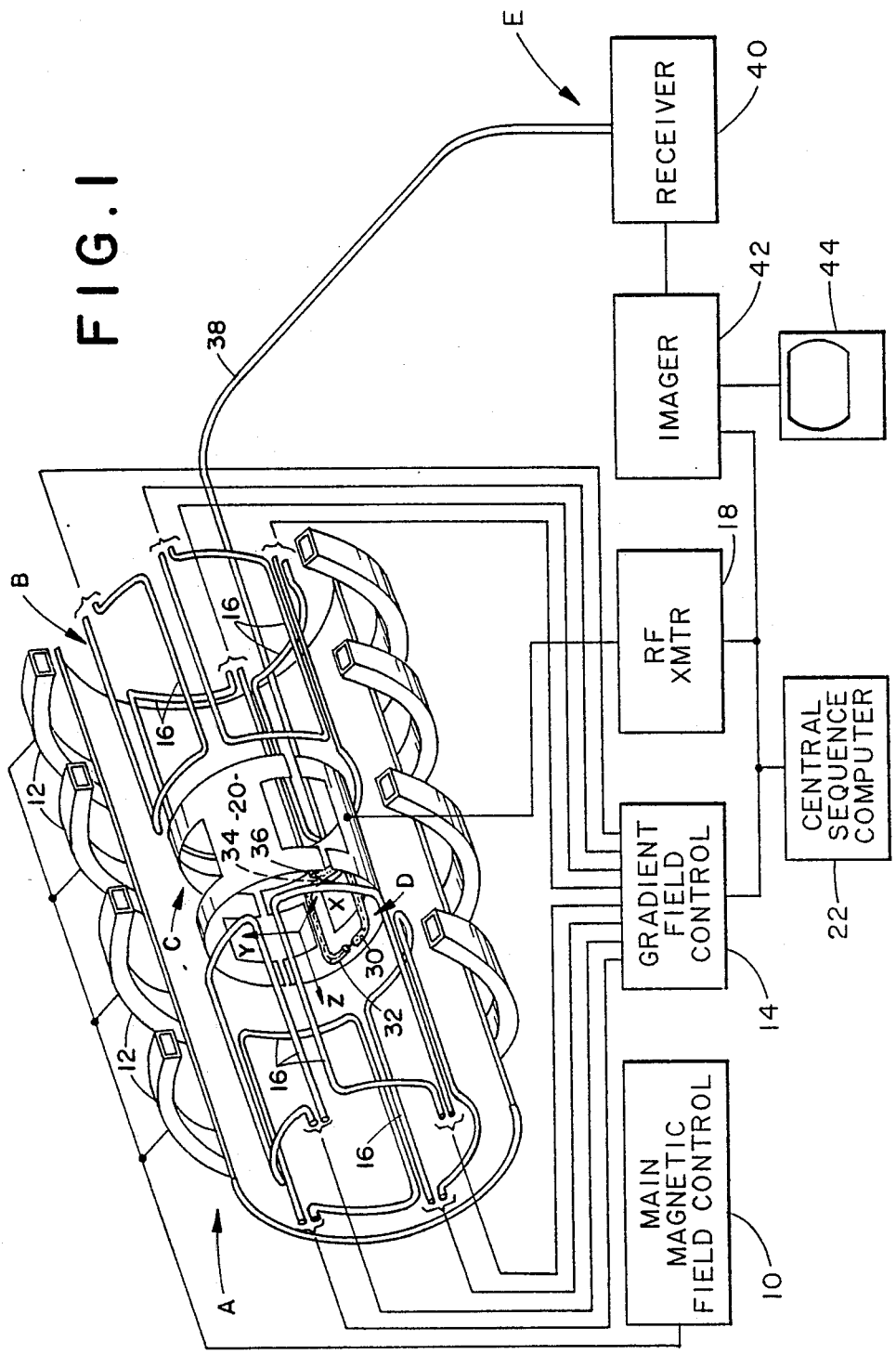
FIG. 1 is a diagrammatic illustration of a magnetic resonance imaging apparatus incorporating the present invention.

With reference to FIG. 1, a magnetic resonance imaging apparatus includes a main magnetic field means A for establishing a generally uniform, main magnetic field longitudinally through an image region along a z-axis. A gradient field means B selectively produces magnetic field gradients transversely across the main magnetic field of the image region. A magnetic resonance excitation means C excites magnetic resonance in selected nuclei of a patient or subject disposed in the image region. The resonating nuclei generate radio frequency magnetic resonance signals which are received by a surface or localized coil D. More specifically, the surface coil is disposed adjacent a preselected region of the subject to be imaged such that it receives magnetic resonance signals from nuclei disposed in the preselected region of interest. Electronic processing circuitry E converts the received radio frequency signals into an image representation indicative of nuclei density, relaxation time, position, nuclei characteristics, or the like.

The main magnetic field means A includes a magnetic field control circuit 10 and a plurality of high power magnets 12. A gradient magnetic field control circuit or means 14 applies current pulses to gradient coils 16 to create gradients across the main magnetic field. The current pulse to each gradient coil is controlled by the gradient field means B to select the angular orientation of the transverse gradient field generated by a gradient field coil assembly 16. The resonance excitation means C includes a radio frequency transmitter 18 and transmission coil 20 to broadcast radio frequency (RF) signals that excite and manipulate magnetic resonance. Optionally, the localized coil D may be connected with the RF transmitter to apply the RF pulses to adjacent regions of the subject. A central computer 22 coordinates the sequence and timing of the gradient field pulses and the RF pulses.

The signals emitted by the relaxation of nuclei in the subject have components only in a plane that is normal to the direction of the static magnetic field, i.e. in the x-y plane, which is normal to the z-axis. Accordingly, only those conductors of the localized coil which intersect the x-y plane will detect the magnetic resonance signals. RF signals from the x-y plane induce a like RF current along the z-axis in the intersecting coil segment.

In high frequency magnetic resonance, the conductors contribute to a heavy interaction with the subject which results in Q loading and reduced sensitivity. When used as a transmitter, the RF current pulses through a z-axis conductor of the localized coil induce magnetic fields in the x-y plane. Magnetic resonance signal components not in the x-y planes, i.e. z-axis components, are attributable solely to noise. Accordingly, it is desirable to suppress reception of the z-axis RF field components.

The localized coil D includes a first or inner conductor 30 hich defines a current path or loop along a surface of the subject adjacent the region of interest. A second or outer conductor or Faraday shield 32 extends parallel to the inner conductor and peripherally therearound. An electrical interconnection 34 interconnects first ends of the inner and outer electrical conductors. An electrical interface 36 couples the localized coil, particularly the second ends of the inner and outer conductors, with a flexible transmission cable 38.

The flexible cable 38 connects the localized coil with the remotely located processing circuitry E. More specifically, the cable conveys the received radio frequency signals from the localized coil to a radio frequency receiver 40. An imager 42 reconstructs an image representation from the received magnetic resonance signals and the magnetic field control and timing information from the central processor 22. The electronic image representation may be converted to a man-readable display by a video monitor or other display means 44.

Figure 2:
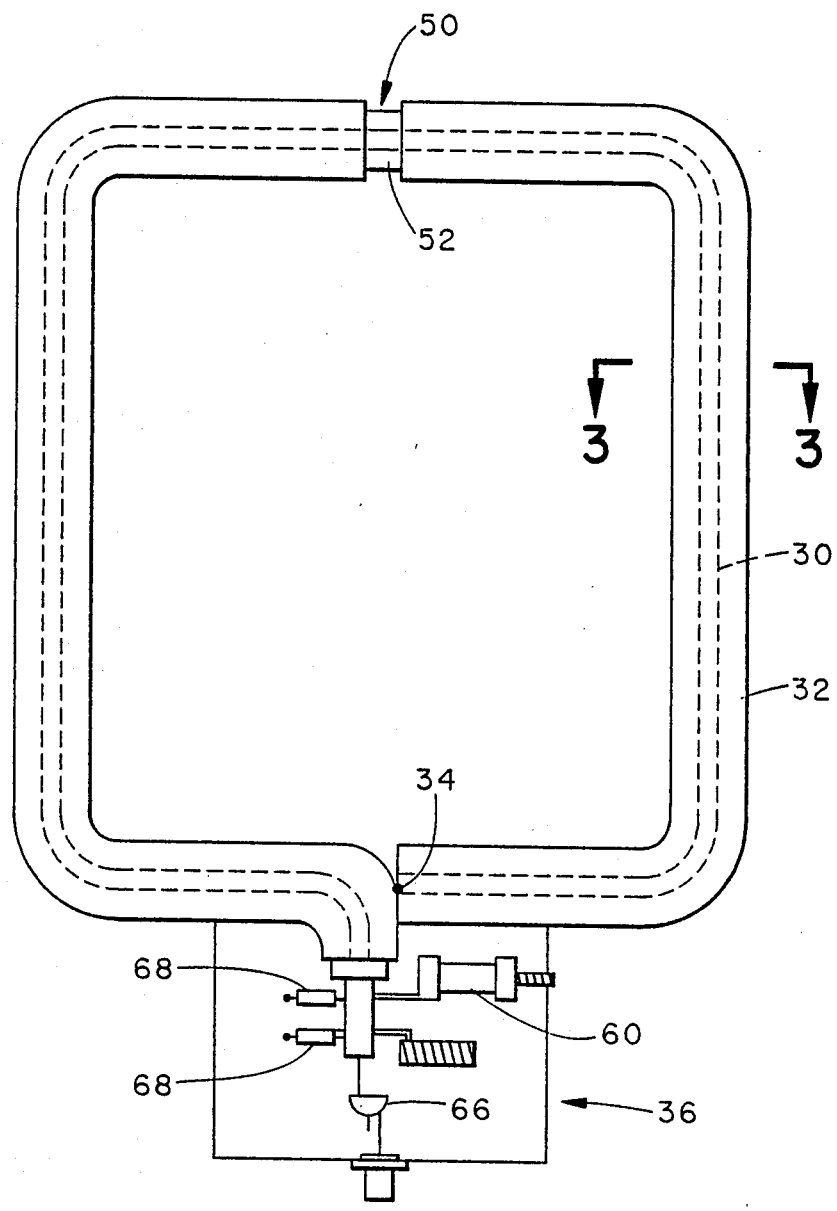
FIG. 2 is an enlarged top plan view of the localized coil construction of FIG. 1.

With reference to FIGS. 2 and 3, the localized coil is a loop of coaxially constructed conductors closed upon itself. At a first end of the loop, the inner or center conductor 30 us shorted 34 to the outer conductor 32. More specific to the preferred embodiment, the outer conductor includes segments of copper tubing 32 which are discontinuous at a gap or opening 50. The inner conductor 30 is the center core of a coaxial cable separated from the outer conductor 32 by a dielectric insulator 52. At a second end, the inner conductor 30 becomes a signal output and the inner conductor 32 is electrically interconnected with each other and a ground 54. Preferably, the first and second ends of the coil are disposed adjacent the interface 36 and the gap 50 is disposed diametrically opposite.

The self resonance of the coaxial cable is governed in significant part by the inductance of the inner conductor and the shunt capacitance of the center conductor to the outer shield. Reducing the shunt capacitance raises the self resonance and Q value of the coil. The shunt capacitance can be reduced by increasing the diameter of the outer conductor or by reducing the dielectric constant of the inter-conductor insulating material 52. Higher velocity factor dielectrics for a given conductor geometry will raise the characteristic impedance and typically the Q value. Air is a suitable high velocity dielectric and is typically less lossy than materials with a high dielectric constant, hence lower velocity factor.

With continuing reference to FIG. 2 and further reference to FIG. 4, the interface circuit 38 includes a variable capacitor 60 for adjusting the resonant frequency of the coil. If the coil were operated above its parallel self resonant frequency, the coil would appear capacitive at the operating frequency. To cancel this capacitive reactance, an inductor 62 is connected in parallel with the capacitor 60 across the inner and outer conductors to enable the coil to be tuned to resonance. A preamplifier means 64 includes a single junction FET 66 connected in a common source configuration. That is, the inner conductor 30 is connected with the gate of the transistor. The source, like one end of the capacitor and inductor, is connected with the ground 54. The drain is connected with the transmission cable 38 to receive motive power therefrom, specifically a DC bias. Connecting the FET in a common source configuration allows the high impedance localized coil to see a high impedance load while driving a lower impedance cable, typically 50 ohms. The preamplified output from the transistor is conveyed superimposed with the DC bias on a pair of coaxial leads of the transmission cable 38. A pair of high speed switching diodes 68 are connected back to back across the coil and the system ground to protect the FET from excessive RF voltage during RF pulse transmission.

With this configuration, the localized coil D appears electrically as a parallel resonance structure trimmed to a selected frequency by the variable capacitor 60 and, if necessary, the inductor 62. The Faraday shielding renders the coil relatively insensitive to electrostatic fields from the environment. Moreover, the electrostatic field generated by excitation of the coil by external means, such as the radio frequency resonance excitation signal, is substantially contained between the inner and outer conductors of the coil. The coil couples magnetically to the environment because the inner loop is viewed from outside of the coil, whereas the outer conductor or shield is not a closed loop.

An incident magnetic field perpendicular to the x-z plane in which the coil lies induces a potential across the output of the coil to the gate of the transistor 66. The level of this potential is increased by the Q value of the coil in proportion to the square root of the Q. Because the Q value of the coil is damped by the magnetic coupling of the coil and the sample, and not by the electrostatic coupling, the available signal is greater than that obtained by an ordinary coil of similar size. Further, because the electrostatic field does not couple outside of the fixed coil geometry, the tuning of the coil is relatively unaffected by the sample.

To the coil, the input of the transistor 66 appears as a near open circuit which minimizes the effect of the transistor on the coils Q value. Further, impedance matching is not required. The coil effectively does not deliver power into the load. The FET input impedance sees the equivalent parallel resistance of the coil at resonance which, of course, is a function of the Q value. Because the transistor is physically adjacent the coil, the equivalent noise input voltage as defined by the transistor noise figure and the thermal noise tracks the coil impedance defined by the loaded Q value over a wide range of impedances. Preferably, the transistor is an FET of a type selected to have an IDSS on the same order as the ID specification for the best noise figure.

A DC power supply 70 is mounted in conjunction with the receiver 40 for applying a DC bias to the coaxial leads of the transmission cable 38. Specifically, a DC bias voltage source 72 is superimposed on the transmission line by a decoupling impedance 74. A DC blocking capacitor 76 blocks the DC bias voltage from reaching the input stage of the receiver 40.

With reference to FIG. 5, the outer conductor 32 need not completely surround the inner conductor 30 in order to shield against electrostatic field losses. Rather, partially surrounding the inner conductor on the side toward the surface of the subject has been found to produce satisfactory shielding.

Figure 6:
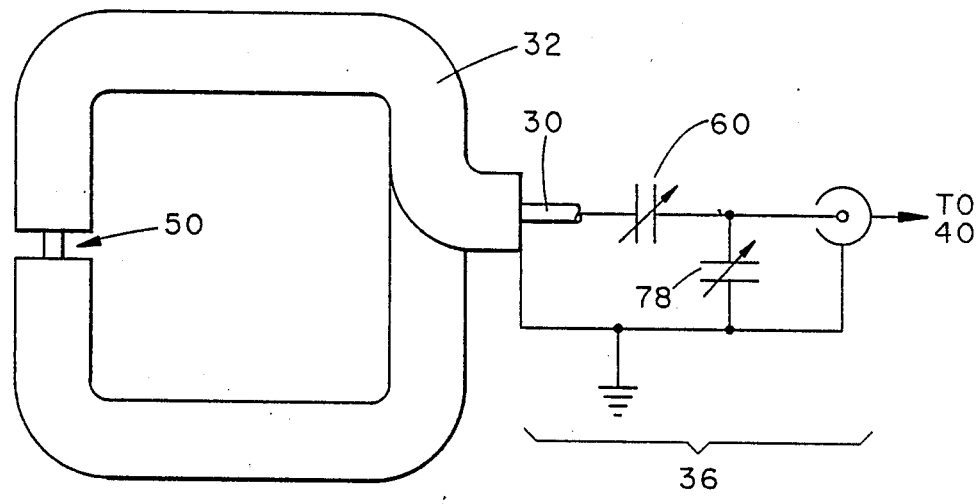
FIG. 6 is an alternate embodiment of the localized coil construction with a passive interface circuit.

With reference to FIG. 6, the interface 36 is a passive interface which is particularly advantageous for mid-field imagers and lower frequency applications. The passive interface includes a tuning capacitor 60 for adjusting the tuning, i.e. for adjusting the resonant frequency of the coil and interface to match the resonance signal center frequency. Optionally, the capacitor 60 may be a varactor diode to enable the coil system to be tuned remotely by superimposing a voltage on cable 38. A matching capacitance 78 matches the coil with the impedance of the cable 38, e.g. a 50 ohm cable. Optionally, an inductor may be connected in parallel to the matching capacitor to raise the self resonant frequency of the coil.

Figure 7:
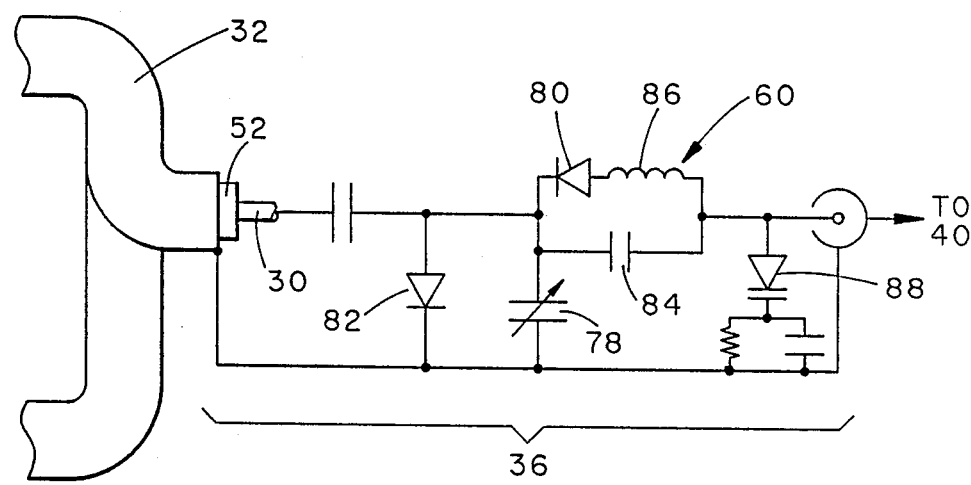
FIG. 7 is another alternate embodiment with an active interface circuit.

With reference to FIG. 7, the interface circuit 36 includes a passive impedance matching network and an active decoupling system. The active decoupling system includes PIN diodes 80, 82 for selectively decoupling the localized coil from the cable. Particularly, when a positive DC bias or current is superimposed on the leads of the cable 38, the diodes are biased on and appear as a very low impedance to radio frequency signals. The diode 82 effectively shorts out the coil deresonating it. The diode 80 effectively connects a capacitor 84 and an inductor 86 in parallel. The inductor is selected to parallel resonate capacitor 84 at the operating frequency, effectively decoupling the coil from the rest of the system. When a negative voltage is superimposed on cable 38, the diodes are biased off and the coil operates as a pick up coil. A varicap diode 88 whose capacitance is remotely adjustable is used to optimize the system performance. In the illustrated embodiment, the varicap diode is biased such that adjusting a negative bias applied across the cable 38 adjusts the capacitance. Optionally, an inductor can be added analogous to inductor 62 to FIG. 4 to raise the self resonance frequency. In operation, a positive DC bias is applied to the cable 38 when the scanner is exciting magnetic resonance. When a magnetic resonance signal is to be received, a negative bias of a magnitude selected to match the resonance frequency of the interface circuit with the center resonance frequency, and to provide an impedance match between the coil and the output load, in the preferred embodiment, the receiver 40.

Figure 8:
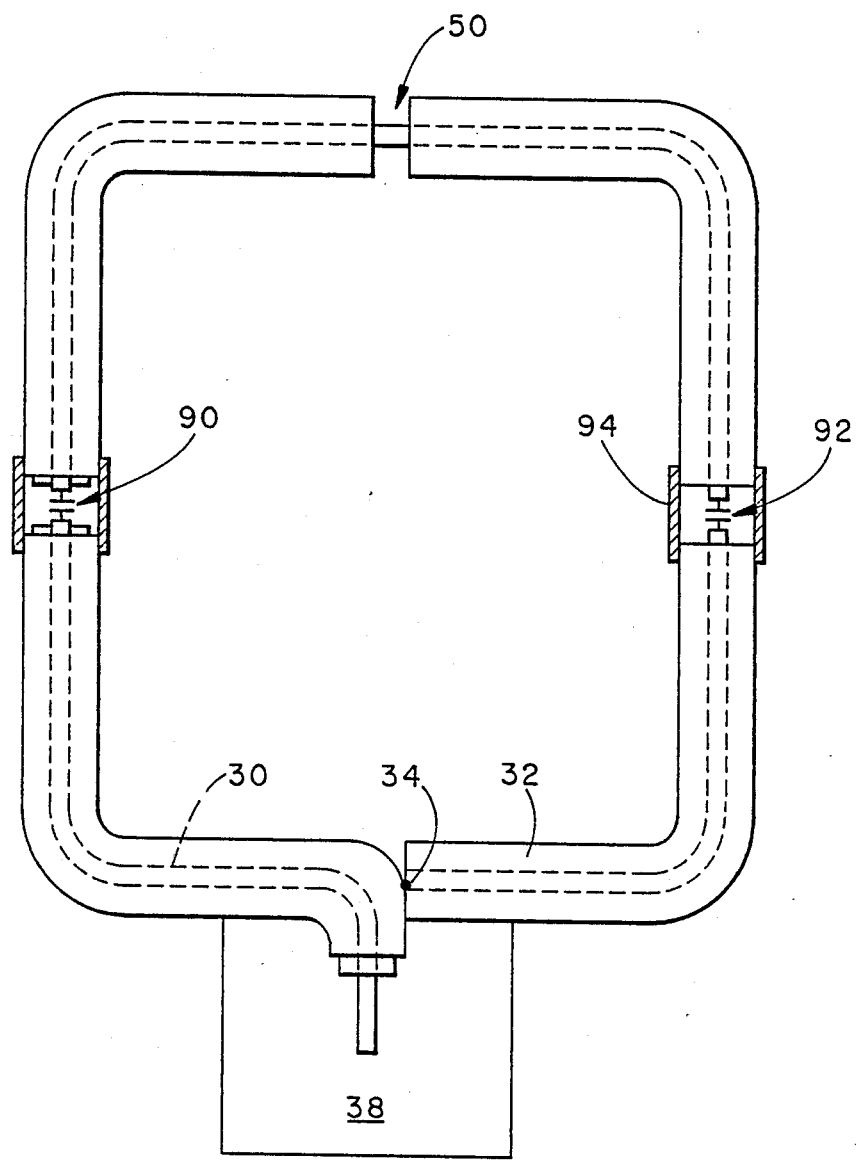
FIG. 8 is a top plan view of another embodiment of a localized coil in accordance with the present invention.

With reference to FIG. 8, the inductor 62 of the embodiment of FIGS. 1-6 enables physically large localized coils to be operated below their self resonance frequency. Alternately, operation below the self resonance frequency can be achieved by connecting capacitors 90, 92 in series with the inner conductor 30. In the preferred embodiment, the outer conductors have additional gaps generally midway between the gap or opening 50 and the ends of the coil to provide access for connecting the capacitors 90, 92. Electrical connectors 94, such as conductive sleeves, provide electrical continuity across the capacitor access gaps. Other numbers of capacitors may, of course, be provided, e.g. a larger plurality of capacitors may be symmetrically or asymmetrically arranged around the coil. Moreover, other constructions may be provided for maintaining electrical continuity of the outer conductor adjacent the capacitor, an integral or welded tubing section, metal leads, or the like. In this manner, the average voltage appearing between the inner conductor 30 and the outer conductor 32 is reduced which reduces the electrostatic field losses within the coil by distributing the radio frequency voltage.

Figure 9:
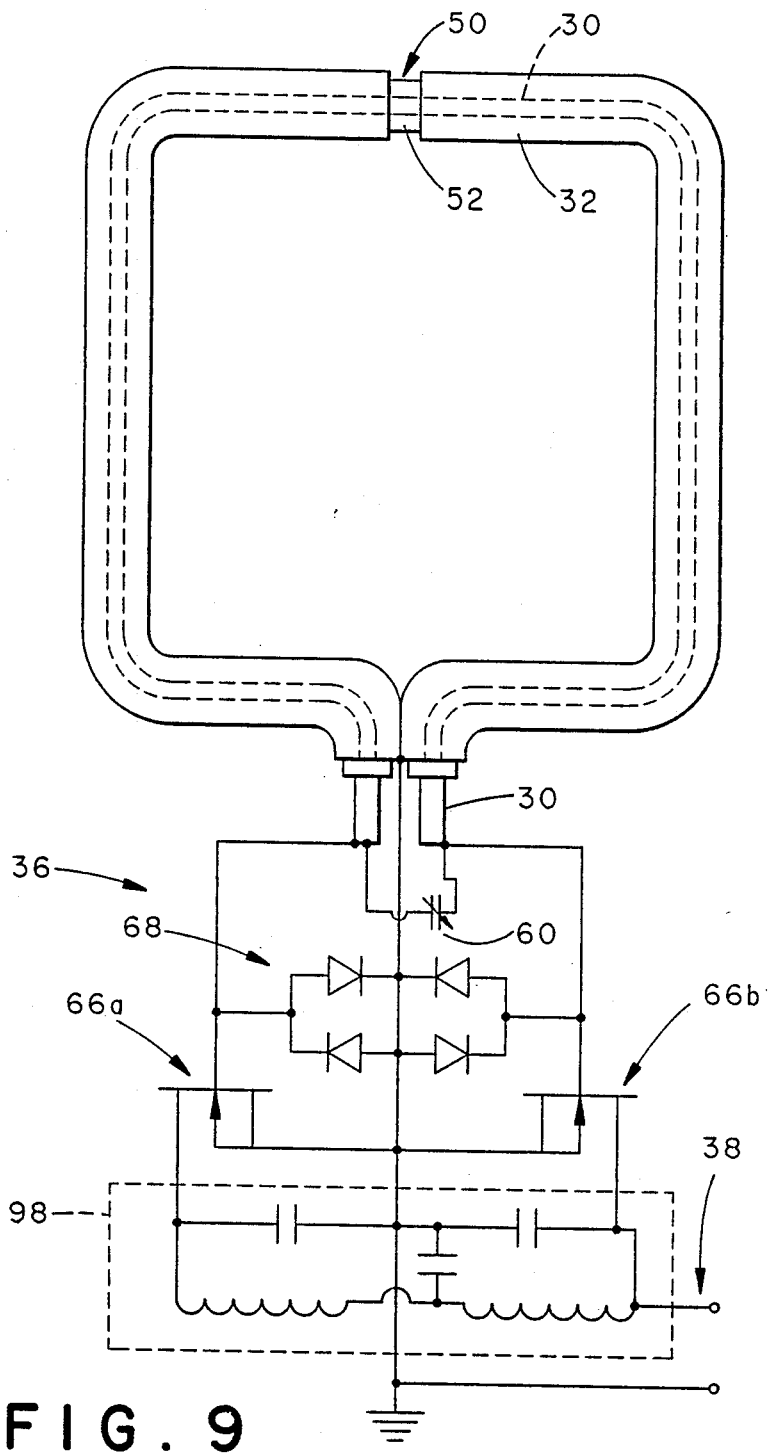
FIG. 9 is a balanced coil alternate embodiment of the localized coil in accordance with the present invention.

With reference to FIG. 9, a balanced coil configuration is provided which raises the self resonant frequency of the localized coil. Specifically, opposite ends of the center conductor 30 are both connected with the interface circuit 38. An adjustable tuning reactance 60 is connected across the ends of the inner conductor to tune the resonant frequency of the coil. A protection diode array 68 connects the ends of the inner conductor with the ground and the outer conductor. The gates of a pair of FET transistors 66a, 66b are each connected to one of the inner conductors. The FETs are connected in a common source configuration with their sources connected to ground and their drains connected to a balun 98. The balun matches the balanced coil configuration to the unbalanced transmission cable 38.

Figure 10:
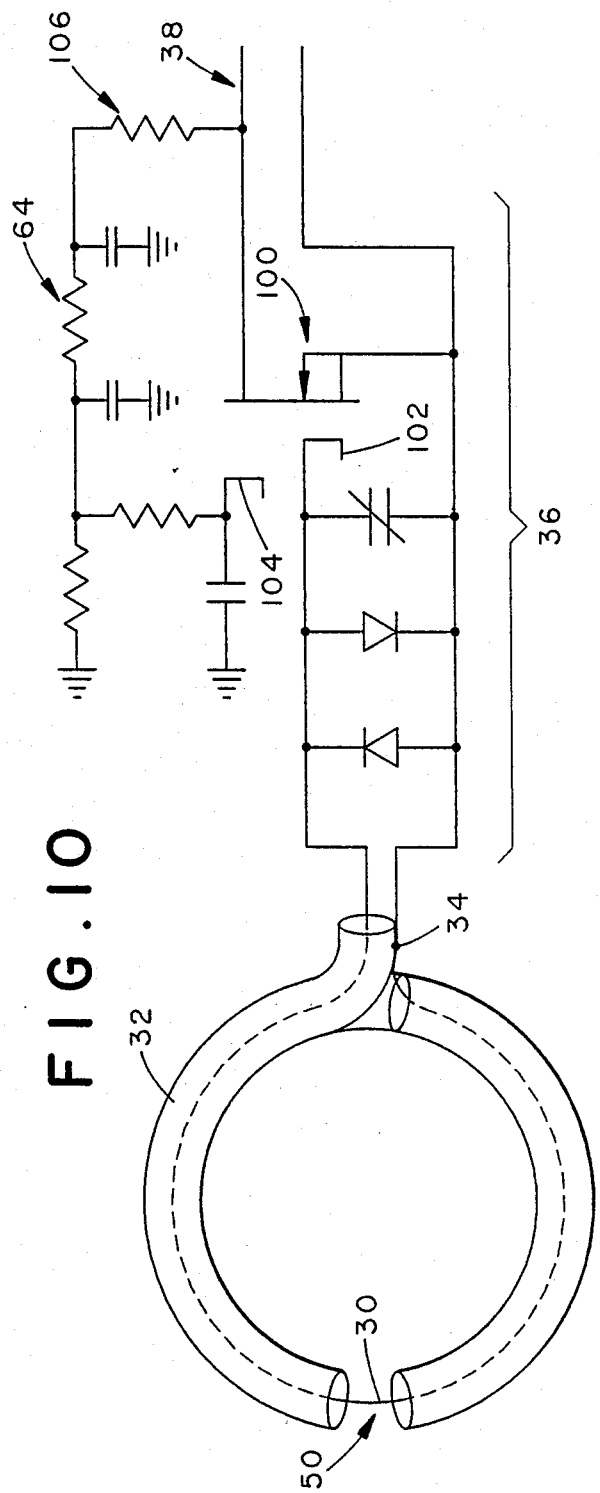
FIG. 10 is a circuit diagram of an alternate embodiment of the localized coil interface circuit; and, FIG. 11 is another alternate embodiment of a surface coil in accordance with the present invention.

With reference to FIG. 10, the preamplifier means 64 may include other solid state arrangements. Utilizing a MOSFET transistor offers the advantage of a higher impedance, hence, a higher coil Q value which can result in substantial gains in the signal-to-noise ratio when a level of loading on the coils is low. In the embodiment of FIG. 10, a dual gate MOSFET 100 has a first gate 102 connected with the inner conductor. A second gate 104 is connected with a decoupling circuit 106 which derives a second gate bias from the drain supply.

Figure 11:
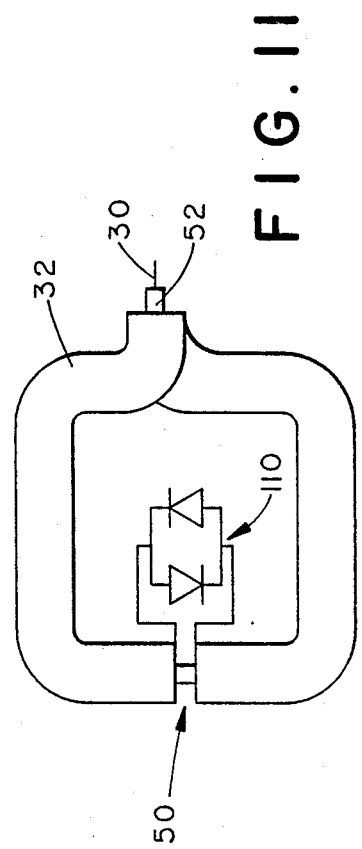

With reference to FIG. 11, a pair of crossed diodes 110 short the gap 50 in the outer conductor. Any incident radio frequency field of a large magnitude will cause the crossed diodes to conduct, thus shorting the gap and preventing the inner conductor from becoming visible to the RF magnetic field. In this manner, the pick up loop 30 can be isolated from the incident radio frequency magnetic resonance excitation fields.

It is to be appreciated that various coil configurations may be provided, such as saddle coils, solenoid coils, Helmholz pair coil geometries and the like.

The invention has been described with reference to the preferred embodiments. Obviously, modifications and alterations will occur to others upon reading and understanding the preceding specification. It is intended that the invention be construed as including all such alterations and modifications insofar as they come within the scope of the appended claims or the equivalents thereof.

Having thus described the preferred embodiments, the invention is now claimed to be:

1. A magnetic resonance apparatus comprising:
   a main magnetic field generating means for generating a magnetic field through an examination region;
   a magnetic resonance excitation means for exciting magnetic resonance of nuclei of a subject in the examination region;
   a localized coil assembly for receiving radio frequency signals from the resonating nuclei, the coil assembly including:
      an inner conductor having a first end, a second end, and defining a first current path adjacent a surface of the subject;
      an outer conductor defining a current path along the inner conductor and at least partially therearound, the outer conductor being disposed between the surface of the subject and the inner conductor, the outer conductor having interconnected first and second ends and at least one opening therein between the subject surface and the inner conductor;
      a connecting means for electrically connecting the inner conductor first end with the outer conductor second end; and,
      an interface means connected with second ends of the inner and outer conductors for interconnecting the conductors with a cable extending to a receiver that is out of the magnetic field, the interface means being disposed within the magnetic field.

2. The apparatus as set forth in claim 1 wherein the interface means includes reactive elements for matching localized coil and cable impedances.

3. The apparatus as set forth in claim 2 wherein the interface further includes PIN diodes for selectively decoupling the localized coil and the cable.

4. The apparatus as set forth in claim 1 wherein the interface means includes a preamplifier.

5. The apparatus as set forth in claim 4 wherein the preamplifier means includes a transistor with its gate or base connected with the inner conductor second end.

6. The apparatus as set forth in claim 1 further including a high velocity factor dielectric material disposed between the inner and outer conductors.

7. The apparatus as set forth in claim 1 wherein the inner and outer conductors are arranged in a loop with their first and second ends adjacent and wherein the outer conductor opening is disposed substantially midway between the first and second ends.

8. A magnetic resonance apparatus comprising:
   a main magnetic field generating means for generating a magnetic field through an examination region;
   a magnetic resonance excitation means for exciting magnetic resonance of nuclei of a subject in the examination region;
   a localized coil assembly for receiving radio frequency signals from the resonating nuclei, the coil assembly including:
      an inner conductor defining a first current path adjacent a surface of the subject;
      an outer conductor defining a current path along the inner conductor and at least partially therearound, the outer conductor being disposed between the surface of the subject and the inner conductor, the outer conductor having at least one opening therein between the subject surface and the inner conductor;
      a connecting means for electrically connecting adjacent first ends of the inner and outer conductors; and,
   an interface means connected with second ends of the inner and outer conductors for interconnecting the conductors with a cable extending to a receiver, the interface means including a transistor with its gate or base connected with the inner conductor and a capacitor connected between the inner and outer conductors.

9. A magnetic resonance apparatus comprising:
   a main magnetic field generating means for generating a magnetic field through an examination region;
   a magnetic resonance excitation means for exciting magnetic resonance of nuclei of a subject in the examination region;
   a localized coil assembly for receiving radio frequency signals from the resonating nuclei, the coil assembly including:
      an inner conductor defining a first current path adjacent a surface of the subject;
      an outer conductor defining a current path along the inner conductor and at least partially therearound, the outer conductor being disposed between the surface of the subject and the inner conductor, the outer conductor having at least one opening therein between the subject surface and the inner conductor;

a connecting means for electrically connecting adjacent first ends of the inner and outer conductors; and, an interface means connected with and adjacent second ends of the inner and outer conductors for interconnecting the conductors with a cable extending to a receiver, the interface means including an FET transistor having its gate electrically connected with the inner conductor, its source connected with the outer conductor and with a first conductor of the cable, and its drain connected with a second conductor of the cable.

10. The apparatus as set forth in claim 9 further including a DC bias means for applying a DC bias between the first and second conductors of the cable.

11. The apparatus as set forth in claim 10 further including at least one reactive component connected between the gate and source.

12. A magnetic resonance apparatus comprising:
a main magnetic field generating means for generating a magnetic field through an examination region;
a magnetic resonance excitation means for exciting magnetic resonance of nuclei of a subject in the examination region;
a localized coil assembly for receiving radio frequency signals from the resonating nuclei, the coil assembly including:
an inner conductor defining a first current path adjacent a surface of the subject;
a generally semicircular outer conductor defining a current path along the inner conductor and at least partially therearound, the outer conductor being disposed between the surface of the subject and the inner conductor, the outer conductor having at least one opening therein between the subject surface and the inner conductor;
a connecting means for electrically connecting adjacent first ends of the inner and outer conductors; and,
an interface means connected with and adjacent second ends of the inner and outer conductors for interconnecting the conductors with a cable extending to a receiver.

13. A magnetic resonance apparatus comprising:
a main magnetic field generating means for generating a magnetic field through an examination region;
a magnetic resonance excitation means for exciting magnetic resonance of nuclei of a subject in the examination region;
a localized coil assembly for receiving radio frequency signals from the resonating nuclei, the coil assembly including:
an inner conductor defining a first current path adjacent a surface of the subject;
an outer conductor defining a current path along the inner conductor and at least partially therearound, the outer conductor being disposed between the surface of the subject and the inner conductor, the outer conductor having at least one opening therein between the subject surface and the inner conductor;
a connecting means for electrically connecting adjacent first ends of the inner and outer conductors;
at least one capacitor connected in series with the inner conductor and between its first and second ends; and,
an interface means connected with and adjacent second ends of the inner and outer conductors for interconnecting the conductors with a cable extending to a receiver.

14. A magnetic resonance apparatus comprising:
a main magnetic field generating means for generating a magnetic field through an examination region;
a magnetic resonance excitation means for exciting magnetic resonance of nuclei of a subject in the examination region;
a localized coil assembly for receiving radio frequency signals from the resonating nuclei, the coil assembly including:
an inner conductor defining a first current path adjacent a surface of the subject;
an outer conductor defining a current path along the inner conductor and at least partially therearound, the outer conductor being disposed between the surface of the subject and the inner conductor, the outer conductor having at least one opening therein between the subject surface and the inner conductor;
a pair of crossed diodes electrically connected with the outer conductor across the opening;
a connecting means for electrically connecting adjacent first ends of the inner and outer conductors;
at least one capacitor connected in series with the inner conductor and between its first and second ends; and,
an interface means connected with and adjacent second ends of the inner and outer conductors for interconnecting the conductors with a cable extending to a receiver.

15. A magnetic resonance apparatus comprising:
a main magnetic field generating means for generating a magnetic field through an examination region;
a magnetic resonance excitation means for exciting magnetic resonance of nuclei of a subject in the examination region;
a localized coil assembly for receiving radio frequency signals from the resonating nuclei, the coil assembly including:
an inner conductor defining at least one loop between first and second ends thereof,
a Faraday shield means including a first conductive portion extending along the inner conductor from adjacent the inner conductor first end and between the inner conductive and the surface of the subject and a second conductive portion extending along the inner conductor from adjacent the inner conductor second end and between the inner conductor and the surface of the subject, the first and second conductive portions defining a gap therebetween,
a first FET transistor having a gate connected with the inner conductor first end, a source connected with the Faraday shield first and second conductive portions and by a transmission cable to a receiver, and a drain connected by the transmission cable to the receiver.

16. The apparatus as set forth in claim 15 further including a second FET transistor having its gate connected to the inner conductor second end, its source connected to the Faraday shield first and second conductive portions, and a drain operatively connected with the transmission cable.

17. The apparatus as set forth in claim 16 further including an adjustable reactive load connected between the inner conductor first and second ends.

18. The apparatus as set forth in claim 15 wherein the transmission cable includes a pair of coaxial leads and further including a balun means interconnecting the transmission cable coaxial leads with the first and second FET transistors; and,
a DC voltage supply operatively connected with the transmission cable leads for applying a DC bias thereacross.

19. A localized coil assembly for receiving radio frequency signals from the resonating nuclei, the coil assembly including:
an inner conductor defining a first current path adjacent a surface of the subject;
an outer conductor defining a current path along the inner conductor and at least partially therearound, the outer conductor being disposed between the surface of the subject and the inner conductor, the outer conductor having interconnected first and second ends and at least one opening therein between the subject surface and the inner conductor;
a connecting means for electrically connecting a first end of the inner conductor with the connected and outer conductor first and second ends; and,
an interface means connected with and immediately adjacent the interconnected inner conductor first end and the outer conductor first and second ends and with an inner conductor second end for coupling the col assembly with a cable extending to a remotely located receiver.

20. The localized coil assembly as set forth in claim 19 wherein the interface means includes at least one active component for selectively decoupling the coil assembly from the cable.

21. A localized coil assembly for receiving radio frequency signals from the resonating nuclei, the coil assembly including:
an inner conductor defining at least one loop between first and second ends thereof;
a Faraday shield including a first conductive portion extending along the inner conductor from adjacent the inner conductor first end and between the inner conductor and the surface of the subject and a second conductive portion extending along the inner conductor from adjacent the inner conductor second end and between the inner conductor and the surface of the subject, the first and second conductive portions defining a gap therebetween;
an FET transistor having a gate connected with the inner conductor, a source connected with the Faraday shield first and second conductive portions, and a drain connected with a transmission cable extending to a receiver.

22. The localized coil assembly as set forth in claim 21 further including a second FET transistor having its gate connected to the inner conductor second end, its source connected to the Faraday shield first and second conductive portions, and its drain operatively connected with the transmission cable.

23. A magnetic resonance method comprising:
disposing an outer conductor parallel to and at least partially around an inner conductor, the outer conductor having an electrical discontinuity therein;
connecting the outer conductor and one end of the inner conductor with a ground;
connecting at least one end of the inner conductor with a preamplifier, which preamplifier is disposed immediately contiguous to the connected ends of the inner and outer conductors;
connecting the preamplifier with a radio frequency receiver located outside of a magnetic field;
disposing a subject in the magnetic field;
disposing the inner and outer conductors and the preamplifier within the magnetic field adjacent a surface of a region of interest of the subject;
exciting magnetic resonance of nuclei in the region of interest of the subject such that radio frequency magnetic resonance signals are generated;
receiving the magnetic resonance signals with the inner conductor, amplifying the magnetic resonance signals with the preamplifier, and conducting the amplified magnetic resonance signals to the receiver.

24. A localized coil assembly for receiving radio frequency signals from resonating nuclei, the coil assembly including:
an inner conductor defining a current path between first and second ends;
an outer conductor having first and second ends and defining a current path along the inner conductor and being disposed at least partially therearound, the outer conductor being disposed between a surface of a subject and the inner conductor, the outer conductor having at least one opening therein between its first and second ends and between the subject surface and the inner conductor;
a first transistor having its gate or base connected with the first end of the inner conductor;
a second transistor having its gate or base interconnected with the second end of the inner conductor, the first and second transistors both being connected with the outer conductor and with a cable for carrying received radio frequency signals to a remotely located receiver.

* * * * *